(12) United States Patent
Gielen et al.

(10) Patent No.: US 9,377,167 B2
(45) Date of Patent: Jun. 28, 2016

(54) ILLUMINATION DEVICE WITH AN ENVELOPE ENCLOSING A LIGHT SOURCE

(71) Applicant: Koninklijke Philips N.V., Eindhoven (NL)

(72) Inventors: Vincent Stefan David Gielen, Eindhoven (NL); Berend Jan Willem Ter Weeme, Eindhoven (NL); Johannes Petrus Maria Ansems, Hulsel (NL); Cornelia Titia Staats, Eindhoven (NL); Theodorus Gerardus Marinus Maria Kappen, Rosmalen (NL); Theodoor Cornelis Treurniet, Best (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 141 days.

(21) Appl. No.: 14/032,229

(22) Filed: Sep. 20, 2013

(65) Prior Publication Data
US 2014/0043788 A1  Feb. 13, 2014

Related U.S. Application Data

(63) Continuation of application No. 13/322,721, filed as application No. PCT/IB2010/052022 on May 7, 2010, now Pat. No. 8,545,033.

(30) Foreign Application Priority Data

May 28, 2009 (EP) ..................................... 09161346
Jul. 22, 2009 (EP) ..................................... 09166081

(51) Int. Cl.
*F21V 9/16* (2006.01)
*F21K 99/00* (2016.01)
*H01L 33/48* (2010.01)
*H01L 33/60* (2010.01)
(Continued)

(52) U.S. Cl.
CPC . *F21K 9/54* (2013.01); *F21K 9/135* (2013.01); *F21K 9/56* (2013.01); *F21V 3/02* (2013.01); *F21V 29/505* (2015.01); *F21V 29/70* (2015.01); *F21V 29/86* (2015.01); *H01L 33/486* (2013.01); *H01L 33/60* (2013.01); *H01L 33/644* (2013.01); *F21Y 2101/02* (2013.01); *H01L 25/0753* (2013.01); *H01L 33/507* (2013.01); *H01L 33/58* (2013.01); *H01L 2924/0002* (2013.01)

(58) Field of Classification Search
CPC ..................... F21Y 2111/007; F21Y 2111/005; F21V 7/22
USPC .................. 362/294, 345, 308, 46, 84; 313/46
See application file for complete search history.

(56) References Cited

U.S. PATENT DOCUMENTS

2004/0116033 A1  6/2004  Ouderkirk et al.
2005/0189557 A1  9/2005  Mazzochette et al.
(Continued)

FOREIGN PATENT DOCUMENTS

CN  1773702 A  5/2006
JP  2001243809 A  9/2001
(Continued)

*Primary Examiner* — Anne Hines (57) ABSTRACT

The invention provides an illumination device comprising an envelope enclosing a light source, preferably a LED, and a luminescent material. The envelope comprises a transmissive part, and a reflective part, wherein the reflective part comprises a reflective ceramic material. The ceramic material can be used for heat dissipation.

20 Claims, 7 Drawing Sheets

(51) Int. Cl.
*H01L 33/64* (2010.01)
*F21V 3/02* (2006.01)
*F21V 29/505* (2015.01)
*F21V 29/70* (2015.01)
*F21V 29/85* (2015.01)
*F21Y 101/02* (2006.01)
*H01L 25/075* (2006.01)
*H01L 33/50* (2010.01)
*H01L 33/58* (2010.01)

(56) References Cited

U.S. PATENT DOCUMENTS

| | | |
|---|---|---|
| 2006/0043546 A1 | 3/2006 | Kraus |
| 2006/0091415 A1 | 5/2006 | Yan |
| 2006/0098440 A1 | 5/2006 | Allen |
| 2006/0105485 A1 | 5/2006 | Basin et al. |
| 2006/0274529 A1* | 12/2006 | Cao ................................ 362/294 |
| 2007/0114562 A1* | 5/2007 | Radkov et al. ................. 257/103 |
| 2007/0131954 A1 | 6/2007 | Murayama et al. |
| 2007/0230188 A1 | 10/2007 | Lin |
| 2007/0243645 A1 | 10/2007 | Lin et al. |
| 2008/0093998 A1 | 4/2008 | Dennery et al. |
| 2008/0123339 A1 | 5/2008 | Bierhuizen et al. |
| 2008/0310158 A1 | 12/2008 | Harbers et al. |
| 2010/0127284 A1 | 5/2010 | Nagai |
| 2010/0182784 A1* | 7/2010 | Foo ................................ 362/235 |

FOREIGN PATENT DOCUMENTS

| | | |
|---|---|---|
| JP | 200649410 A | 2/2006 |
| JP | 2007234639 A | 9/2007 |
| JP | 2009070870 A | 4/2009 |
| WO | 2008078235 A2 | 7/2008 |
| WO | 2010002710 A1 | 1/2010 |
| WO | 2010031810 A1 | 3/2010 |
| WO | 2010058325 A1 | 5/2010 |

* cited by examiner

ILLUMINATION DEVICE WITH AN ENVELOPE ENCLOSING A LIGHT SOURCE

CROSS-REFERENCE TO RELATED APPLICATIONS

This application is a continuation of currently pending U.S. patent application Ser. No. 13/322,721, filed on Nov. 28, 2011, which is a national stage filing of PCT/IB2010/052022 filed on May 7, 2010, which claims the benefit of European Patent Application No. 09161346.3 filed on May 28, 2009 and European Patent Application No. 09166081.1 filed on Jul. 22, 2009. The aforementioned applications are hereby incorporated by reference in their entireties.

FIELD OF THE INVENTION

The invention relates to an illumination device with an envelope enclosing a light source as well as to a lamp, such as a spot light, comprising such illumination device.

BACKGROUND OF THE INVENTION

Illumination devices comprising a transmissive ceramic layer are known in the art. Transmissive ceramic layers or luminescent ceramics, and their method of preparation, are known in the art. It is for instance referred to US200510269582. US2005/0269582 amongst others describe a semiconductor light emitting device combined with a ceramic layer which is disposed in a path of light emitted by the light emitting layer. The ceramic layer is composed of or includes a wavelength converting material such as a luminescent material.

Illumination devices with a transmissive cover and a luminescent material are for instance described in US2007/0114562. This document describes for instance yellow and red illumination systems, including a semiconductor light emitter, and a luminescent material. The systems have an emission falling within the respective ITE red and yellow color bins having specified color coordinates on the CIE chromaticity diagram. The luminescent material may include one or more luminescent materials. The illumination systems may be used as the red and yellow lights of a traffic light or an automotive display.

US2007/0114562 further describes a LED illumination system comprising a support on which the semiconductor light emitter is disposed, a cover disposed on the support over the semiconductor light emitter, the cover and the support cooperatively defining an interior volume containing the semiconductor light emitter; and an encapsulant disposed in the interior volume and encapsulating the semiconductor light emitter. The luminescent material is deposited on an inside surface of the cover.

SUMMARY OF THE INVENTION

A disadvantage of the prior art systems may be that such systems may not easily be miniaturized or boosted in power (high light intensity applications) because of the fact that the heat to which the luminescent material is disposed increases. This heat may deteriorate the luminescent material and/or lead to thermal quenching. Further, also other parts of the illumination device may not withstand relative high temperatures.

Hence, it is an aspect of the invention to provide an alternative illumination device, which preferably further obviates one or more of these drawbacks.

Further, for illumination devices comprising an envelope enclosing a light source and a luminescent material, it is in general desired to provide an envelope that facilitates mixing of luminescent material light and light source light ("mixing chamber"). Likewise, when the illumination device comprises light sources generating light at different wavelengths, mixing of light may also be desired. Therefore, there is also a desire to provide an alternative reflective material for the mixing chamber, that preferably in addition also facilitates heat dissipation.

In a first aspect, the invention provides an illumination device comprising an envelope enclosing a light source, preferably a light emitting diode (LED), arranged to generate light source light, wherein the envelope comprises a transmissive part (herein also indicated as "window" or "exit window"), arranged to transmit at least part of the light source light, thereby providing illumination device light downstream of the transmissive part, and a reflective part, arranged to reflect at least part of the light source light, wherein the reflective part comprises a reflective ceramic material.

In this embodiment, the light source may for instance comprise an RGB LED (red green blue light emitting diode), or a plurality of diodes arranged to provide white light, such as an RGB combination, or a combination of blue and yellow, or a combination of blue, yellow and red, etc. Optionally, the illumination device may be arranged to provide colored light.

In another embodiment, the light source comprises a light source, or a plurality of light sources (such as a plurality of LEDs), that is (are) able to provide light at different predetermined wavelengths, depending upon the driving conditions. Hence, in a specific embodiment, the illumination device may further comprise a controller (attached to or external from the illumination device), arranged to control the color of the illumination device light in response to a sensor signal or a user input device signal.

The terms "upstream" and "downstream" relate to an arrangement of items or features relative to the propagation of the light from a light generating means (here the light source, such as the LED), wherein relative to a first position within a beam of light from the light generating means, a second position in the beam of light closer to the light generating means is "upstream", and a third position within the beam of light further away from the light generating means is "downstream".

In a preferred embodiment, the invention provides such illumination device, wherein the envelope further encloses a luminescent material, arranged to absorb at least part of the light source light and emit luminescent material light, wherein the envelope comprises the transmissive part, arranged to transmit at least part of the light source light or at least part of the luminescent material light or both at least part of the light source light and at least part of the luminescent material light, thereby providing illumination device light downstream of the transmissive part, and the reflective part arranged to reflect at least part of the light source light or at least part of the luminescent material light or both at least part of the light source light and at least part of the luminescent material light, wherein the reflective part comprises a reflective ceramic material. Especially, the transmissive part is arranged to transmit at least part of the luminescent material light or both at least part of the light source light and at least part of the luminescent material light.

Therefore, according to a further aspect, the invention provides an illumination device comprising an envelope enclosing a light source, preferably a LED, arranged to generate light source light, and a luminescent material, arranged to absorb at least part of the light source light and emit luminescent material light, wherein the envelope comprises a transmissive part, arranged to transmit at least part of the light source light or at least part of the luminescent material light or both at least part of the light source tight and at least part of the luminescent material light, thereby providing illumination device light downstream of the transmissive part, and a reflective part arranged to reflect at least part of the light source light or at least part of the luminescent material light or both at least part of the light source light and at least part of the luminescent material light, wherein the reflective part comprises a reflective ceramic material.

Advantageously, such illumination device may be an efficient light source, with good color mixing, with efficient heat dissipation, and having robustness. This is especially due to the use of ceramic materials as well as the use of luminescent materials remote from the tight source (latter embodiments). The ceramic material may have a relatively good thermal conductivity. Preferably, the thermal conductivity is at least about 5 W/mK, such as at least about 15 W/mK, even more preferably at least about 100 W/mK. YAG has a thermal conductivity in the range of about 6 W/mK, poly crystalline alumina (PCA) in the range of about 20 W/MK, and AlN (aluminum nitride) in the range of about 150 W/mK or larger.

Preferably, the reflective part is arranged to reflect at least part of the light source light and at least part of the luminescent material light. Further, preferably the transmissive part is arranged to transmit at least part of the light source light, especially when the light source light is in the visible range of the wavelength spectrum, and at least part of the luminescent material light.

Below, the invention is further described with reference to a LED as preferred embodiment of the tight source. Hence, below the term "LED" refers to tight source in general, unless indicated otherwise or clear from the context, but preferably refers to a LED. Further, the term "LED" especially refers to solid state lighting (solid state LEDs).

Preferably, the luminescent material, if present, is arranged remote from the LED. Herein, "remote from the LED" especially indicates that the luminescent material is arranged at a non-zero distance from the LED die. Preferably, the shortest distance between the LED die and the luminescent material is in the range of 0.5-50 mm, especially in the range of 3-20 mm. The LED die is the light emitting surface of the LED.

Remote luminescent material in LED based light sources seems to be very advantageous with respect to system efficacy, in particular for generation of light with a low color temperature (warm white). Applying a luminescent material coating on a transmissive support or film may result in high system efficacy because only little light may be reflected back into the LED where it has a rather high chance of being absorbed. Using the luminescent material remote from the LEDs can result in efficacy gains up to about 50% compared to systems with luminescent material in the LED package.

Applying a luminescent material layer at the surface, especially the emitting surface (i.e. downstream surface), of an exit window may result in a rather saturated color point of that surface when the lamp is off and when it is illuminated with white light. The degree of saturation of the appearing color of the exit window can be reduced by applying, according to the invention, the luminescent material between the LED and a (diffusive, translucent material) exit window. The (translucent) exit window acts as the virtual emission window (for the further optional optical system, where the light may be further manipulated for e.g. beam shaping). With increasing distance between the luminescent material layer and the translucent exit window, the saturation of the color of the translucent exit window is further reduced.

The term "ceramic" is known in the art and may especially refer to an inorganic, non-metallic solid prepared by the action of heat and subsequent cooling. Ceramic materials may have a crystalline or partly crystalline structure, or may be amorphous, i.e., a glass. Most common ceramics are crystalline. The term ceramic especially relates to materials that have sintered together and form pieces (in contrast to powders). Typical ceramic materials are described herein and are also described in the references cited herein. The ceramics used herein are preferable polycrystalline ceramics. The reflective ceramic material may in an embodiment also be a reflective ceramic coating.

The envelope is especially arranged to receive all light from the light source. Further, the envelope is especially arranged to allow escape of light of the light source and/or the luminescent material substantially only via the transmissive part. The envelope may thus also be indicated as mixing chamber. Mixing may be of relevance when pluralities of light sources are used which generate light at different wavelengths. Mixing may also be of relevance when a luminescent material is used that is arranged remote from a light source (from which it absorbs part of the light to provide luminescent material light).

The transmissive part may also be indicated as window. Preferably, the transmissive part is translucent. This may, amongst others, prevent a viewer from perceiving the light source(s) and optional optics within the envelope.

The term light source may (thus) refer to a plurality of light sources. Therefore, in an embodiment, the illumination device comprises a plurality of light sources. Further, the term luminescent material may refer to a plurality of luminescent materials. Hence, in an embodiment the luminescent material comprises a plurality of luminescent materials (such as 2-4 luminescent materials). Likewise, the terms "reflective part" and "transmissive part" may refer to a plurality of reflective parts and transmissive parts, respectively.

As mentioned above, the use of the ceramic material may allow a relative efficient transfer of heat; even more this may be the case when the ceramic material is in contact with a heat sink. Heat sinks are known in the art, and may especially refer to an object that absorb and dissipate heat from another object using thermal contact (either direct or radiant). Preferably, the heat sink is in physical contact with the light source. Hence, the phrase "the ceramic material is in contact with a heat sink", and similar phrases, preferable refers to an arrangement wherein the ceramic material is in physical contact with a heat sink.

In another preferred embodiment, the reflective part is in contact with a heat sink; this may even better facilitate heat dissipation. Heat may especially be generated by the light source and within the luminescent material (Stokes losses).

In a specific embodiment, the heat sink comprises a ceramic material, more especially is a ceramic material. In this way, the heatsink and reflector part may in an embodiment be provided as one single ceramic piece. Thereby, the heat transport may even further be improved. On the one hand, the (ceramic) heat sink per se may allow dissipation of thermal energy. By arranging the heat sink in contact with a ceramic reflective part (including embodiments wherein the reflective part and heat sink are integrated) and/or a ceramic transmissive part, dissipation may be enhanced, since the reflective and/or transmissive ceramic parts, respectively, may in this way also have the function of a heat sink, and thus promote further dissipation.

In an embodiment, the ceramic material is based on one or more materials selected from the group consisting of $Al_2O_3$, AlN, $SiO_2$, $Y_3Al_5O_{12}$ (YAG), an $Y_3Al_5O_{12}$ analogue, $Y_2O_3$ and $TiO_2$, and $ZrO_2$. The term an $Y_3Al_5O_{12}$ analogue refers to garnet systems having substantially the same lattice structure as YAG, but wherein Y and/or Al and/or O, especially Y and/or Al are at least partly replaced by another ion, such as one or more of Sc, La, Lu and G, respectively.

In a preferred embodiment, $Al_2O_3$, ceramic material is applied as reflective material. $Al_2O_3$, can be made highly reflective when it is sintered at a temperature in the range of about 1300-1700° C., such as in the range of about 1300-1500° C., like 1300-1450° C. This material is also known in the art as "brown" PCA (polycrystalline alumina)

The phrase "based on" indicates that the starting materials to make the ceramic material substantially consist of one or more of the herein indicated materials, such as for instance $Al_2O_3$ or $Y_3Al_5O_{12}$ (YAG). This does however not exclude the presence of small amounts of (remaining) binder material, or dopants, such as Ti for $Al_2O_3$, or in an embodiment Ce for YAG.

In an embodiment, the transmissive part is further arranged to transfer heat to the heat sink. In another embodiment, the transmissive part is part of the heat sink. An advantage of these embodiments is that the heat generated by the LEDs is efficiently removed to the surroundings.

As will be clear to the person skilled in the art, the luminescent material light and the illumination device light are at least partly, or entirely, in the visible range of the wavelength spectrum (i.e. 380-780 nm). The light source emits in an embodiment also in the visible, but may in an embodiment alternatively or additionally also emit in the UV. As mentioned above, in a preferred embodiment, the light source comprises a LED. In a further embodiment, the light source is a LED arranged to generate blue light. The blue light emitting source may be used per se, or may be used in combination with luminescent material, such as to provide white light, or may be used in combination with one or more other LEDs generating tight at other wavelengths. Combinations of such embodiments may also be applied. When using a blue emitting LED and yellow emitting luminescent material (that is excited by the blue light), further aced emitting LED may be provided. The red emitting LED may be used to tune to color point to a lower temperature and/or increase the CRI of the light provided by the illumination device. The luminescent material may be chosen to have a high transmission for red light. For instance YAG:Ce may be used. Hence, the illumination device may further comprise a LED arranged to generate red light. Hence, in an embodiment the LED light source is arranged to provide blue light and the illumination device further comprises a yellow emitting luminescent material and optionally one or more other luminescent materials arranged to emit in the green, yellow, orange or red, especially in the red, wherein the yellow emitting luminescent material and the optionally one or more other luminescent materials are arranged to absorb at least part of the blue light en emit with the indicated colors, and wherein optionally the illumination device further comprises one or more further LED light sources, arranged to provide light in the visible, especially in one or more of the green, yellow, orange or red, especially in the red. This may especially be of interest to improve CRI and/or efficiency.

Hence, in an embodiment, the illumination device comprises luminescent material, and the luminescent material is arranged to provide together with the (blue) light source light white illumination device light. In yet another embodiment, the light source comprises a LED arranged to emit light having a wavelength selected from the range of 285-400 nm, such as 300-400 nm, and the luminescent material is arranged to absorb at least part of this (UV/bluish) light and to emit light (in the visible range). In such embodiment, the illumination device comprises luminescent material, and the luminescent material may be arranged to provide together with the (UV/bluish) light source light white illumination device light or may in embodiment be arranged to provide colored light.

In an embodiment, at least part of the luminescent material is provided in a coating to an upstream face of the transmissive part. The transmissive part has an upstream face, directed to the light source, and a downstream face, directed to the exterior of the illumination device. At least part of the luminescent material may be provided as coating to the upstream face and/or the downstream face, preferably to the upstream face. Preferably, the light source and the luminescent material are not in physical contact with each other (i.e. non-zero shortest distance between light source and luminescent material).

Phrases like "transmit at least part of the light source light or at least part of the luminescent material light or both at least part of the light source light and at least part of the luminescent material light" indicate part or all of the light source light, part or all of the luminescent material light, and part or all of the light source light and part or all of the luminescent material light, respectively. The term "at least" may herein in embodiments also indicate "all" or "completely". The term "transmissive" herein indicates that at least part of the light in the visible part of the spectrum that is provided perpendicular to the transmissive item, may pass that item. Preferably, the transmission is at least about 10%, even more preferably at least about 20%, yet even more preferably at least about 40%, and yet even more preferably at least about 80% or higher (perpendicular irradiation). Here, the term transmission relates to the transmission averaged over the visible wavelength range (380-780 nm). A transmissive item may be translucent (transmitting and scattering of light) or be transparent (substantial unhindered transmission). The terms transparent and translucent are known in the art. The term "reflective" herein indicates that at least part of the light in the visible part of the spectrum that is provided perpendicular to the reflective item, may be reflected by that item. Preferably, the reflection is at least about 80%, even more preferably at least about 90%, yet even more preferably at least about 95%, and yet even more preferably at least about 99% or higher (perpendicular irradiation). Here, the term reflective relates to the reflection averaged over the visible wavelength range (380-780 nm). Reflection may be specular (angle of reflection is substantially angle of incidence) or diffusive (scattering), and optionally both.

In an embodiment, at least part of the luminescent material is embedded in the transmissive part. When making the transmissive part, the luminescent material may for instance be combined with the starting material(s) so make the transmissive part. For instance, when the transmissive part is a ceramic material, to the starting material(s) for making the ceramic materials luminescent material may be added. The term "embedded" may thus refer to luminescent material as separate entity/entities within the transmissive part. However, the luminescent material may in an embodiment also be prepared into a ceramic material, such as cerium containing garnet ceramic. Ceramic materials of the latter type are herein also indicated as luminescent ceramics. It is known in the art to make for instance YAG:Ce ceramic (see also below). In this way, a transmissive (especially translucent) and luminescent window may be provided.

As already indicated above, the transmissive part may comprise transmissive ceramic material. This may even further improve heat dissipation, since ceramic materials may relatively efficiently dissipate heat, in contrast to polymeric transmissive parts, that may have be suggested in the prior art. The ceramic material preferably is based on one or more materials selected from the group consisting of $Al_2O_3$, AlN, $SiO_2$, $Y_3Al_5O_{12}$ (YAG), an $Y_3Al_5O_{12}$ analog, $Y_2O_3$, $TiO_2$, and $ZrO_2$. In a preferred embodiment, $Al_2O_3$, ceramic material is applied as transmissive material. $Al_2O_3$, can for instance be made highly reflective when it is sintered at a temperature in the range of about 1500-2000° C., such as 1600-2000° C. Further, preferably the transmissive part is in contact with a heat sink.

In a specific embodiment, at least part of the luminescent material is arranged downstream of the light source and upstream of the transmissive part (see also above), and the transmissive part is preferably substantially transparent. The luminescent material may in an embodiment be arranged at the light source, such as at an LED die (distance luminescent material LED is zero) or embedded in a resin on the LED, however, the luminescent material may also be provided as layer arranged remote from the light source and remote from the transmissive part. In yet another embodiment, the luminescent material is provided as coating to the transmissive part (see also above). In such embodiment, the transmissive pad is not necessarily translucent, but may also be transparent, which may be beneficial in view of transmissivity. Hence, in another embodiment the transmissive part may be translucent.

In an embodiment, the envelope may have a hexagonal cross-section. This advantageously may improve light mixing. In yet another embodiment, the envelope has a circular cross section, Preferably, the reflective part has a circular or hexagonal cross section. The reflective part may for instance comprise a cylinder or hexagonal tube, with a transmissive part closing one opening of the cylinder or tube. The transmissive part may for instance be flat or may have the shape of a dome.

The invention provides in a further aspect a lamp, such as a spot light, comprising an illumination device as defined herein.

In yet a further embodiment, the lamp may comprise a plurality of illumination devices, such as 2 or 4. Especially, such lamp may further comprise a support structure arranged to support the plurality of illumination devices. Further, the support structure may be arranged to provide at least part of the reflective parts, respectively. In addition or alternatively, the support structure may be arranged to support the light emitting diode (LED) light sources, respectively. Further, the support structure may comprise or consist of a ceramic material. Especially, the support structure may (thus) be arranged as heat sink, and may optionally be in contact with or be integrated with a heat sink in a heat sink housing. Hence, the support may be a reflective ceramic material, that may further be arranged to dissipate part of the thermal energy of the LED light sources.

In yet a further aspect, the invention also provides the use of a ceramic material in an illumination device for heat dissipation; this may be a transmissive part, and/or a reflective part, and/or other parts.

Specific elements of the invention are further elucidated in more detail below.

Illumination Device

The illumination device is herein also shortly indicated as "device". The transmissive part, such as a translucent exit window, has an upstream face directed to the LED(s) and a downstream face, directed to the exterior of the illumination device.

As mentioned above, this transmissive part, or exit window, is arranged to allow light escape from the illumination device. However, further optics are not excluded, such as collimators, reflectors, light guides, optical layers etc. to guide or influence the illumination device light, which may be arranged downstream of the exit window.

With the invention, remote luminescent material modules and lamps can be realized that have very high efficiency and good color rendering.

The illumination device of the invention is especially arranged to generate light with a predetermined color, such as white light.

The proposed configurations can be applied in large area lighting, ambiance lighting (e.g. light tiles), backlighting (e.g. poster boxes), downlighters, diffuse retrofit lamps such as incandescent (GLS) or TL replacement lamps, and wall washers and, depending on volume and beam constraints, in some spot lamps. The illumination device may be used indoor, for instance in homes, in hospitality areas, in offices, in retail, outdoor, as street lighting. The term "retrofit" is known in the art, see for instance U.S. Pat. No. 5,463,280.

Below, some further details concerning the LED and luminescent material, the transmissive window, and ceramics will be found, respectively.

LED and Luminescent Material

In an embodiment, the LED is arranged to emit blue emission and the luminescent material comprises (a) a green luminescent material, arranged to absorb at least part of the blue LED emission and to emit green emission, and (b) a red luminescent material, arranged to absorb at least part of the blue LED emission, or at least part of the green emission, or both at least part of the blue emission and at least part of the green emission and to emit red emission. In this way, the light of a predetermined color may be white light. Depending upon amongst others LED power, the blue LED emission spectrum, and luminescent material amounts white light of different color temperatures may be composed.

In another embodiment, the LED is arranged to emit blue emission and the luminescent material comprises (a) a yellow luminescent material, arranged to absorb at least part of the blue emission and to emit yellow emission, and optionally (b) one or more other luminescent materials, arranged to absorb at least part of the blue LED emission, or at least part of the yellow emission, or both at least part of the blue emission and at least part of the yellow emission, and to emit emission at an emission wavelength different from the yellow emission. Also in this way, the light of a predetermined color may be white light. Depending upon amongst others the blue LED emission spectrum, LED power and luminescent material amounts, white light of different color temperatures may be composed. In a specific embodiment, the luminescent material, in addition to the yellow luminescent material (a) further comprises (b) a red luminescent material, arranged to absorb at least part of the blue LED emission, or at least part of the yellow emission, or both at least part of the blue emission and at least part of the yellow emission and to emit red emission. This red luminescent material may amongst others be applied to further improve the CRI.

In an embodiment, the illumination device comprises a plurality of light emitting diodes (LEDs) arranged to emit LED emission, such as in the order of 2-100, like 4-64.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL, especially within about 10

SDCM from the BBL, even more especially within about 5 SDCM from the BBL. The term "predetermined color" may relate to any color within the color triangle, but may especially refer to white light.

The terms "blue light" or "blue emission" especially relates to light having a wavelength in the range of about 410-490 nm. The term "green light" especially relates to light having a wavelength in the range of about 500-570 nm. The term "red light" especially relates to light having a wavelength in the range of about 590-650 nm. The term. "yellow light" especially relates to light having a wavelength in the range of about 560-590 nm. The term "bluish light" is used to indicate light in the range of about 380-410 nm. Visible light is considered to be in the range of about 380-780 nm.

These terms do not exclude that especially the luminescent material may have a broad band emission having emission with wavelength(s) outside the range of for instance about 500-570 nm, about 560-590 nm, and about 590-650 nm respectively. However, the dominant wavelength of emissions of such luminescent materials (or of the LED, respectively) will be found within the herein given ranges, respectively. Hence, the phrase "with a wavelength in the range of" especially indicates that the emission may have a dominant emission wavelength within the specified range.

Especially preferred luminescent materials are selected from garnets and nitrides, especially doped with trivalent cerium or divalent europium, respectively. Embodiments of garnets especially include $A_3B_5O_{12}$ garnets, wherein A comprises at least yttrium or lutetium and wherein B comprises at least aluminum. Such garnet may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, assuming $(Y_{1-x}Lu_x)_3Al_5O_{12}$:Ce, part of Y and/or Lu is replaced by Ce. This notation is known to the person skilled in the art. Ce will replace A in general for not more than 10%; in general, the Ce concentration will be in the range of 0.1-4%, especially 0.1-2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

The red luminescent material may in an embodiment comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10, more especially in the range of about 0.5-5% relative to the cation(s) it replaces. The term ":Eu", indicates that part of the metal ions is replaced by Eu (in these examples by Eu$^{2+}$). Por instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein is one or more elements selected from the group consisting of barium (Ba), strontium (Sr) and calcium (Cu); especially, comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu (i.e. 75% Ba; 25% Sr). Here, Eu is introduced and replaces at least part of M i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

The term luminescent material herein especially relates to inorganic luminescent materials, which are also sometimes indicated as luminescent materials. These terms are known to the person skilled in the art.

Transmissive Part (Exit Window)

Especially at a non-zero distance from the downstream surface of the transmissive window a (in an embodiment translucent) transmissive part or exit window is arranged. This exit window is arranged to allow illumination device light escape from the illumination device.

The exit window may in an embodiment comprise an organic material. Preferred organic materials are selected from the group consisting of PET (polyethylene terephthatate), PE (polyethylene), PP (polypropylene), PC (polycarbonate), P(M)MA (poly(methyl)metacrylate), PEN (polyethylene napthalate), COC (cyclo olefin copolymer) and PDMS (polydimethylsiloxane). However, in another embodiment the exit window comprises an inorganic material. Preferred inorganic materials are selected from the group consisting of glasses, (fused) quartz, ceramics, and silicones, preferably, ceramics. As mentioned above, in a specific embodiment, the transmissive part comprises a transmissive ceramic material.

The exit window is in an embodiment translucent. For instance, the above mentioned materials may have intrinsic translucent properties or may be made translucent (for instance by frosting (for instance by sand blasting or acid etching) the material, Such methods are known in the art. The translucent exit window may allow some light to pass through, but the interior (i.e. upstream objects of the illumination device, upstream from the exit window) seen through translucent material are substantially diffused or indistinct.

As mentioned above, in a further embodiment, the exit window comprises at least part of the luminescent material. In another embodiment, the exit window comprising a luminescent material (layer) is further provided with a coating on the upstream side that comprises also part of the luminescent material (which may have a substantially different emission color or a substantially similar emission color).

Ceramics

Transmissive ceramic layers or luminescent ceramics, and their method of preparation, are known in the art. It is for instance referred to U.S. patent application Ser. No. 10/861,172 (US2005/0269582), to U.S. patent application Ser. No. 11/080,801 (US2006/0202105), or to WO2006/097868, to WO2007/080555, to US2007/0126017 and to WO2006/114726. The documents, and especially the information about the preparation of the ceramic layers provided in these documents, are herein incorporated by reference.

The ceramic layers may especially be self-supporting layers, and may be formed separately from the semiconductor device, then in an embodiment be attached to the finished semiconductor device or in another embodiment be used as a growth substrate for the semiconductor device. The ceramic layers may be translucent or transparent, which may reduce the scattering loss associated with non-transparent wavelength converting layers such as conformal luminescent material layers (i.e. powder layers). Luminescent ceramic layers may be more robust than thin film or conformal luminescent material layers. In addition, since luminescent ceramic layers are solid, it may be easier to make optical contact to additional optical elements such as lenses and secondary optics, which are also solid.

A ceramic luminescent material may in an embodiment be formed by heating a powder luminescent material at high temperature until the surfaces of the luminescent material particles begin to soften and a liquid surface layer forms. The partially melted particle surfaces promote interparticle mass transport which leads to the formation of a "neck" where the particles join. The redistribution of the mass that forms the neck causes shrinkage of the particles during sintering and produces a rigid agglomerate of particles. Uniaxial or isostatic pressing steps, and vacuum sintering of the preformed "green body" or the sintered predensified ceramic may be necessary to form a polycrystalline ceramic layer with low residual internal porosity. The translucency of the ceramic luminescent material, i.e. the amount of scattering it produces, may be controlled from high opacity to high transparency by adjusting the heating or pressing conditions, the fabrication method, the luminescent material particle precursor used, and the suitable crystal lattice of the luminescent material. Besides luminescent material, other ceramic forming materials such as alumina may be included, for example to facilitate formation of the ceramic or to adjust the refractive index of the ceramic. Polycrystalline composite materials that contain more than one crystalline component or a combination of crystalline and amorphous or glassy components can also be formed, for example, by cofiring two individual powder luminescent materials such as an oxonitridosilicate luminescent material and a nitridosilicate luminescent material.

In a specific embodiment, a ceramic luminescent material may be formed by traditional ceramic processes. A "green body" is formed by dry pressing, tape casting, slib casting, amongst others. This green body is then heated at elevated temperature. During this sintering stage, neck formation and interparticle mass transport take place. This causes a strong reduction of the porosity and consequently shrinkage of the ceramic body. Residual porosity depends on the sintering conditions (temperature, heating, dwell, atmosphere). Hot uniaxial or hot isostatic or vacuum sintering of the preformed "green body" or the sintered predensified ceramic may be necessary to form a polycrystalline ceramic layer with low residual internal porosity.

Examples of luminescent materials that may for instance be formed into luminescent ceramic layers include aluminum garnet luminescent materials with the general formula $(Lu_{1-x-y-a-b}Y_xGd_y)_3(Al_{1-z-c}Ga_zSi_c)_5O_{12-c}N_c:Ce_aPr_b$ wherein $0 \le x < 1$, $0 \le y < 1$, $0 \le x \le 0.1$, $0 < a \le 0.2$, $0 \le b \le 0.1$, and $0 \le c < 1$ such as $Lu_3Al_5O_{12}:Ce^{3+}$. $Y_3Al_5O_{12}:Ce^{3+}$ and $Y_3Al_{4.8}Si_{0.2}O_{11.8}N_{0.2}:Ce^{3+}$ which emit light in the yellow-green range; and $(Sr_{1-x-y}Ba_xCa_y)_{2-z}Si_{5-a}Al_aN_{8-a}O_a:Eu_z^{2+}$ wherein $0 \le a < 5$, $0 \le x \le 1$, $0 \le y \le 1$, $0 \le x+y \le 1$ and $0 < z \le 1$ such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red luminescent materials may also be suitable, including $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $(Sr_{1-x-y}Ba_xCa_y)_2SiO_4:Eu^{2+}$ including, for example $SrGa_2SiO_4:Eu^{2+}$; $Ca_{1-x}Sr_xS:Eu^{2+}$ wherein $0 \le x \le 1$ including, for example, $CaS:Eu^{2+}$ and $SrS:Eu^{2+}$; $(Ca_{1-x-y-z}Sr_xBa_yMg_z)_{1-n}(Al_{1-a+b}B_a)Si_{1-b}N_{3-b}O_b:RE_n$, wherein $0 \le x \le 1$, $0 \le y \le 1$, $0 \le z \le 1$, $0 \le a \le 1$, $0 \le b \le 1$ and $0.002 \le n \le 0.2$ and RE is selected from europium(II) and cerium(III) including for example $CaAlSiN_3:Eu^{2+}$ and $CaAl_{1.04}Si_{0.96}N_3:Ce^{3+}$; and $M_x^{V+}Si_{12-(m+n)}Al_{m+n}O_nN_{16-n}$, with x=m/v and M being a metal, preferably selected out of the group comprising Li, Mg, Ca, Y, Sc, Ce, Pr, Nd, Sm, Eu, Gd, Tb, Dy, Ho, Er, Tm, Yb, Lu or mixtures thereof including, for example, $Ca_{0.75}Si_{8.625}Al_{3.375}N_{0.625}:Eu_{0.25}$.

Unlike a luminous powder film, which comprises luminescent material particles with large optical discontinuities in refractive index with the binder or surrounding material, and unlike a monocrystalline luminescent body, which optically behaves as a single, large luminescent material particle with no optical discontinuities, a polycrystalline luminescent ceramic may behave as tightly packed individual luminescent material particles, such that there are (substantially) only small optical discontinuities at the interface between different luminescent material particles. By reducing the optical discontinuities the optical properties of a monocrystalline luminescent body are approached. Thus, luminescent ceramics like LuAG (which exhibits a cubic crystal structure that enables transparency) are optically almost homogenous and have the same refractive index as the luminescent material forming the luminescent ceramic. Unlike a conformal luminescent material layer or a luminescent material layer disposed in a transparent material such as a resin, a luminescent ceramic generally requires no binder material (such as an organic resin or epoxy) other than the luminescent material itself, such that there is very little space or material of a different refractive index between the individual luminescent material particles. As a result, a luminescent ceramic may be transparent or translucent, unlike a conformal luminescent material layer that exhibits more and/or larger optical discontinuities in the layer.

As mentioned above, in specific embodiment, the transmissive ceramic layer comprises a cerium containing garnet ceramic, especially the $A_3B_5O_{12}:Ce$ garnet ceramic (as also defined above), wherein A comprises at least lutetium and wherein B comprises at least aluminum, more especially a $(Y_{1-x}Lu_x)_3B_5O_{12}:Ce$ garnet ceramic, wherein x is larger than 0 and equal to or smaller than 1. Especially, B is aluminum. The phrase "the transmissive ceramic layer comprises a cerium containing garnet ceramic" especially relates to a ceramic which substantially consists or entirely consists of such material (here in this embodiment garnet).

Transmissive ceramic layers are known in the art, see also above. The transparency of a transparent ceramic layer may be defined using the transmission as a measure for the scattering properties of the layer. The transmission is especially defined as the ratio of the amount of light transmitted (also after internal reflection and scattering) through by the ceramic layer away from a diffuse light source and the amount of light emitted from the diffuse tight source that irradiates the ceramic layer. The transmission can for instance be obtained by mounting a ceramic layer, with for instance a thickness in the range of 0.07-2 mm, such as about 120 micrometer, in front of a diffuse emitter of red light with a dominant wavelength between 590 and 650 nm, and then measuring the above defined ratio.

Some ceramics may also be made to be highly reflective. For instance, alumina may be highly reflective (99% reflection or even 99.5% reflection).

In a specific embodiment, the reflective ceramic material has for instance a mean reflection in the range of >95%, like >98% in the wavelength range of 400-750 nm. For instance, poly crystalline alumina was prepared having a reflection in the range of 400-500 nm in the range of about 98-99% and in the range of 500-750 nm in the range of about 99-99.5

The transmissive material, especially a transmissive ceramic material, has for instance a mean a mean transmission of at least 99%, or even at least 99.5% in the range of 450-750 nm.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

DESCRIPTION OF PREFERRED EMBODIMENTS

Figure 1A:
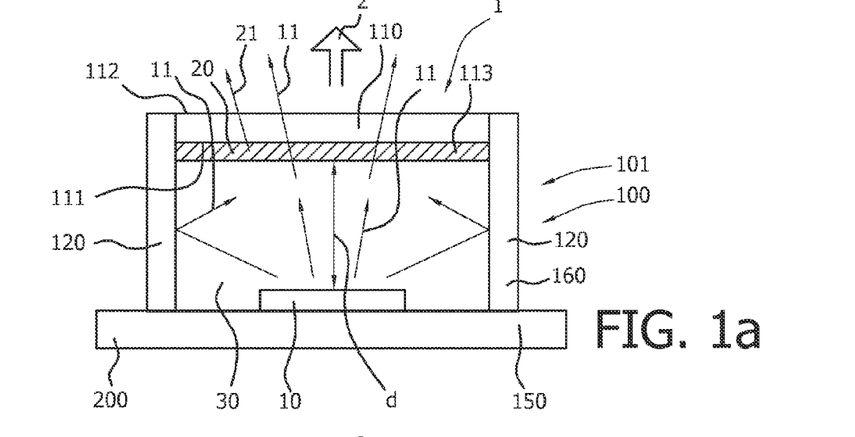
FIGS. 1a-1j schematically depict embodiments of the illumination device.

FIG. 1a schematically depicts an embodiment of an illumination device 1 according to the invention. The illumination device 1 comprising an envelope 100 enclosing a light source 10, arranged to generate light source light 11, such as a light emitting diode (LED). The envelope 100 creates a cavity or chamber 30, which encloses the light source 10, In general, the envelope 100 at least comprises a bottom part or substrate 150 and an enclosure part 101, which enclosure part 101 may have different shapes.

The envelope 100 comprises a transmissive part 110, arranged to transmit at least part of the light source light 11 thereby providing illumination device light 2 downstream of the transmissive part 110, and a reflective part 120 arranged to reflect at least part of the light source light 11. The reflective part 110 comprises a reflective ceramic material.

In the schematically depicted embodiment of FIG. 1a, the envelope 100 essentially consists of the substrate 150 and the enclosure part 101, wherein the latter essentially consists of wall(s) 160 and transmissive part 110. The wall(s) 160 essentially consist of the reflective part 120. In this way, the enclosure comprises reflective part 120 and transmissive part 120.

The substrate 150 may comprise a heat sink 200 or function as heat sink 200. In this way, the reflective part 120 may be in contact with the heat sink 200. In the embodiment depicted in FIG. 1a, the envelope 100 further encloses a luminescent material 20, arranged to absorb at least part of the light source light 11 and emit luminescent material light 21. Therefore, especially in such embodiments, the envelope 100 comprises the transmissive part 110, arranged to transmit one or more selected from the group consisting of at least part the tight source tight 11 and at least part of the luminescent material light 21. Thereby illumination device light 2, downstream of the transmissive part 110, may be provided. Further, the reflective part 120 may be arranged to reflect one or more selected from the group consisting of at least part of the light source light 11 and at least part of the luminescent material light 21. The reflective part 110 comprises a reflective ceramic material.

The transmissive part 110, also indicated as window or exit window, comprises an upstream face 111, directed to the light source 10, and a downstream face 112, directed to the exterior. In this embodiment, at least part of the luminescent material 20 (in this drawing all luminescent material 20) is provided in a coating 113 to the upstream face 111 of the transmissive part 110.

In the illumination device 1, the light source 10 is upstream of the transmissive part 110; the transmissive part 10 is downstream of the light source 10. The upstream face 111 is upstream of the downstream face 112, but the upstream face 111 is of course downstream of the light source 10.

Reference d indicates the shortest distance between the light source 10, especially the LED die, and the luminescent material 20.

Light 11 generated by the light source 10 may be reflected at the reflective part(s) 120 and most of the reflected light may, together with direct light, eventually leave the chamber 30 through the transmissive part 110. Light leaving the illumination device 1 is indicated with reference 2. In the embodiment of FIG. 1a, device light 2 may comprise luminescent material light 21 and light source light 11.

The schematically depicted embodiment of FIG. 1a may for instance be a cross-section of a cubic, toroidal, hexagonal or circular (tubular) device 1.

Figure 1B:
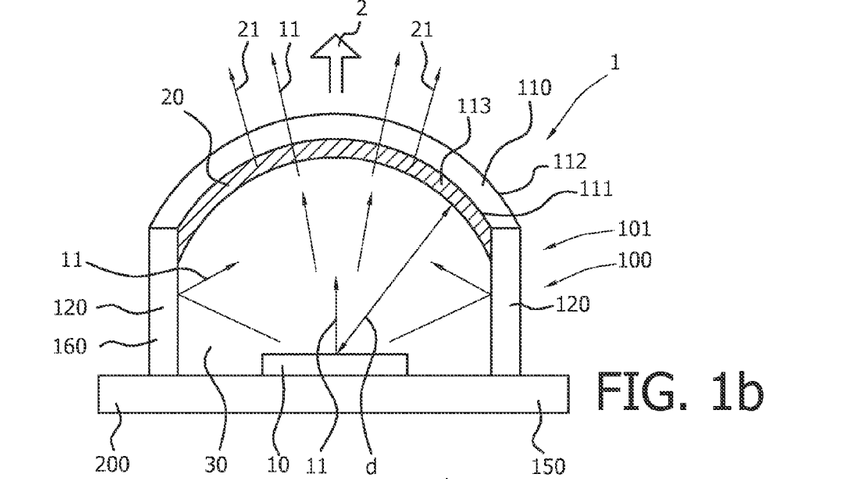

FIG. 1b schematically depicts an embodiment wherein the envelop 100 comprises a dome part. In this embodiment, the transmissive part 110 is arranged as dome. In this schematically depicted embodiment, again the luminescent material 20 is, solely by way of example, included, and, also by way of example, depicted as coating to the upstream face 111 of the transmissive part 110.

Figure 1C:
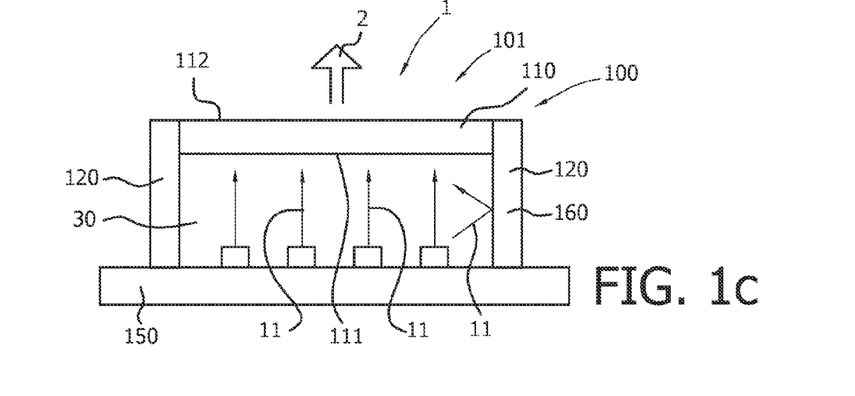

FIG. 1c schematically depicts an embodiment without luminescent material 20; although the light source(s) 10 may in a variant comprise a white emitting LED based on luminescent material (not depicted). The light source(s) 10 (here by way of example 4 light sources 10 are depicted) may for instance be RGB LEDs or may be LEDs that individually provide KGB colors or other color combinations (blue-yellow; blue-yellow-red; etc.) that provide white light.

Figure 1D:
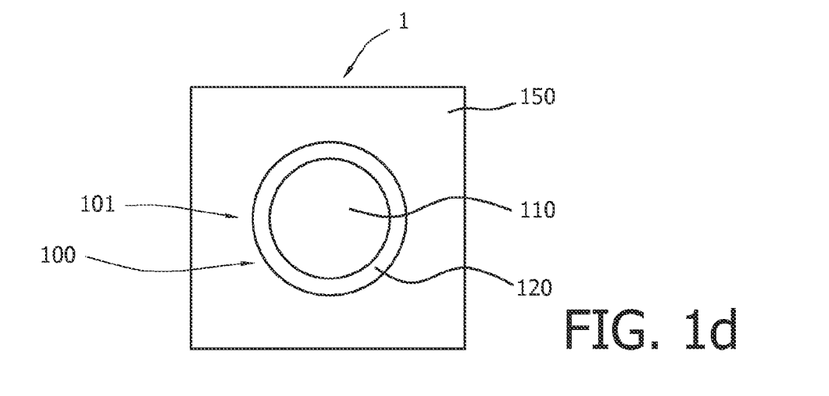
Figure 1E:
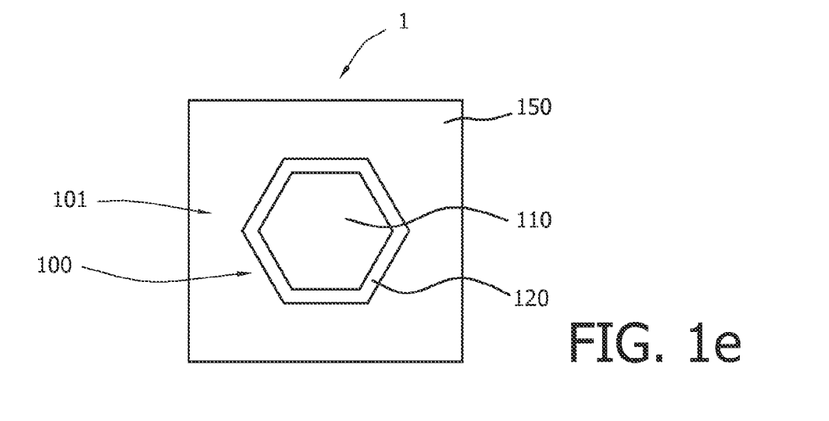

FIGS. 1d-1e schematically show top views of examples of the illumination device 1 according to embodiments of the invention, wherein the former shows an embodiment wherein the envelope 100 may have a tubular (see for instance FIG. 1a), or tubular-dome (see for instance FIG. 1b), or dome shape, and wherein the latter shows an embodiment wherein the envelope 100 has a hexagonal shape (see for instance FIG. 1a).

Figure 1F:
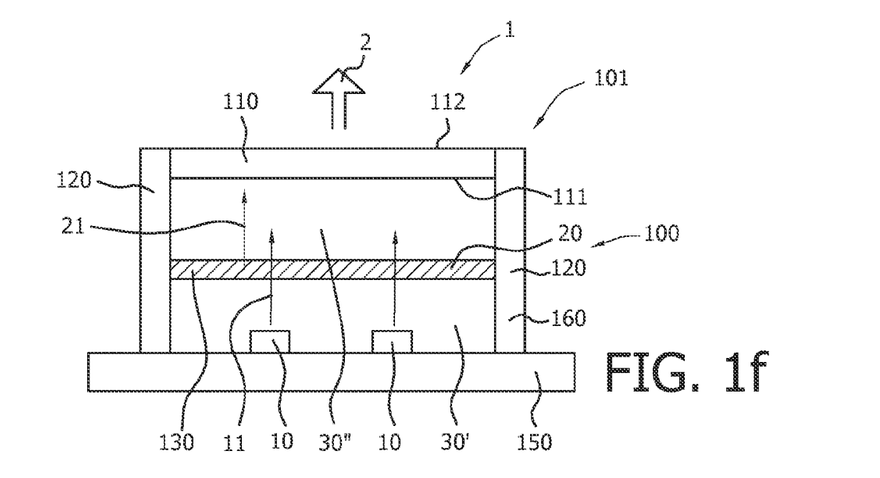

FIG. 1f schematically depicts an embodiment wherein the luminescent material 20 is arranged downstream of the light source(s) 10 and upstream of the transmissive part 110. For instance, a transmissive intermediate window 130 may be provided that comprises the luminescent material 20 as coating (to the upstream and/or downstream face), or that comprises the luminescent material 20 as embedded material (depicted). For instance, this transmissive intermediate window 130 may be a polymeric foil comprising luminescent material, or may preferably be a luminescent ceramic material.

The chamber 30 is in the way, in which this embodiment is schematically depicted, divided in a first chamber 30', upstream of the intermediate window 130, and a second chamber 30", downstream of the intermediate window 130. In principle, more intermediate windows 130 may be present. An intermediate window 130 comprising luminescent material, arranged at a non-zero distance from the transmissive part 110 may have the advantage that when the transmissive part 110 is translucent, this translucent part may be perceived as white (when the transmissive part 110 is substantially colorless), although the intermediate window 130 might be colored (for instance when colored luminescent materials 20 like YAG doped with cerium and/or nitrides doped with europium would be used).

Figure 1G:
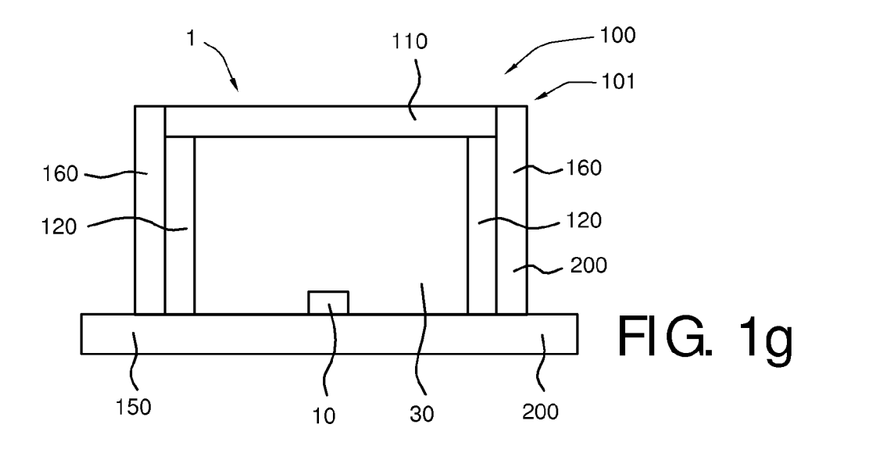

FIG. 1g schematically depicts an embodiment wherein the wall(s) 160 have reflective parts (indicated with reference 120) at the interior side of the wall(s). Such wall(s) might be or might function as heat sink 200, Hence, in this way the transmissive part 110 may also be in contact with the heat sink 200. The reflective ceramic material 120 may in an embodiment be a reflective ceramic coating (to walls 160).

Though not depicted in the above FIGS. 1a-1g, the area of the substrate 150 within the envelope 100 not being occupied with light source(s) 10 will in general also comprise reflective material, which may in an embodiment also a reflective part 120 (i.e. ceramic reflector).

Figure 1H:
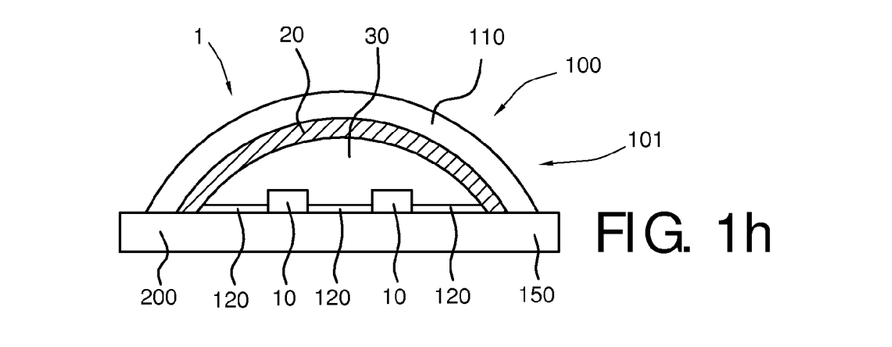

FIG. 1h schematically depicts an embodiment wherein the enclosure part 101 substantially consists of a dome. Hence, envelope 100 here comprises a substrate 150 and a dome, wherein the latter comprises the transmissive part 110. As the substrate 150 may comprise or may function as heat sink 200, in this way the transmissive part 110 may also be in contact with the heat sink 200. Note that the dome might in an embodiment—not depicted—also comprise a reflective part 120 and a transmissive part 110. In this embodiment, by way of example, the area of the substrate 150 within the envelope 100 not being occupied with light source(s) 10 comprises reflective materials reflective part(s) 120, These reflective ceramic material part(s) 120 may in an embodiment be a reflective ceramic coating (to for instance substrate 150). The reflective ceramic material part(s) 120 arranged on at least part of the area of the substrate 150 within the envelope 100 not being occupied with light source(s) 10, is herein also indicated as reflective ceramic bottom parts 126 (see also below).

Figure 1I:
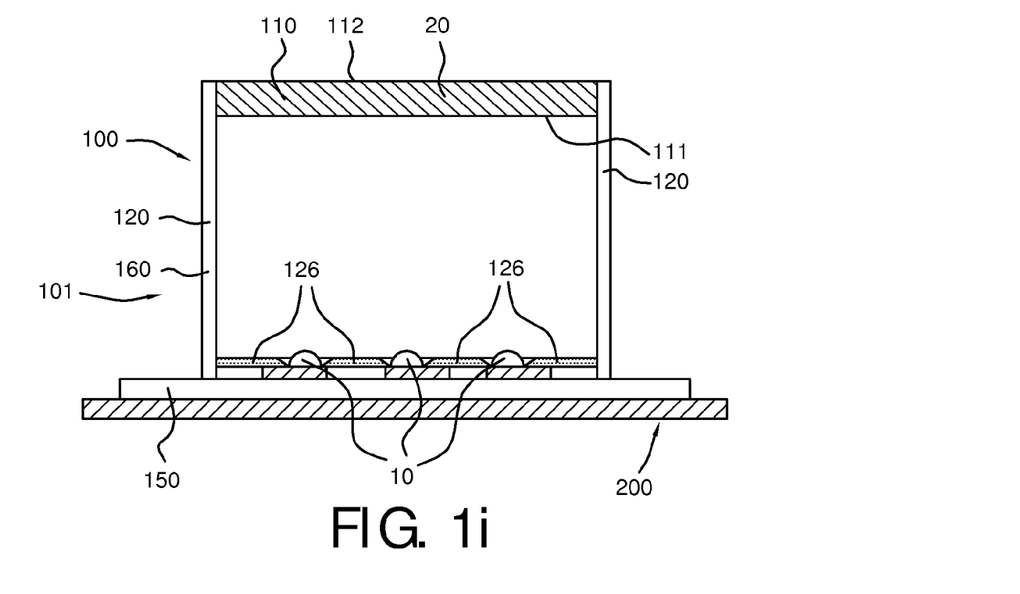

FIG. 1i schematically depicts an embodiment analogues to the embodiment schematically depicted in FIG. 1a, with the exception that in this figure by way of example a transmissive luminescent ceramic is applied as transmissive part 110 (and thus also as luminescent material 20) and that in more detail a variant is depicted wherein the area of the substrate 150 within the envelope 100 not being occupied with light source (s) 10 comprise reflective materials, such as reflective part(s) 120, which are here indicated as reflective ceramic bottom parts 126. The reflective ceramic bottom part(s) 126 may in an embodiment also comprise reflective ceramic material coating(s).

It may for instance be possible to produce part of the envelope 100, for instance (all) reflective part(s) 120, with an extrusion process or with an injection moulding process. This may also apply to the transmissive part 110.

Figure 1J:
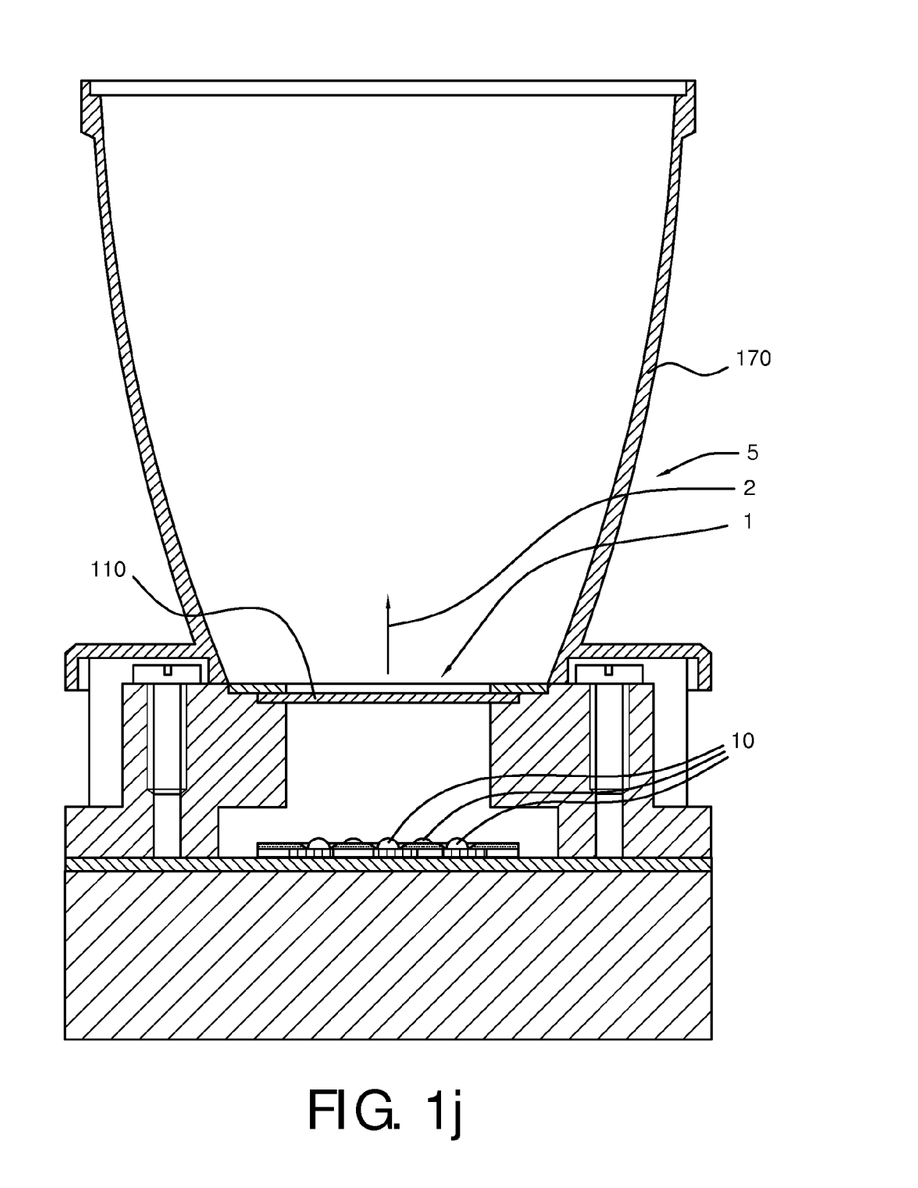

FIG. 1j schematically depicts a lamp 5, such as a spot light, as example of a high light intensity embodiment, comprising the illumination device 1 and optics 170, arranged to collimate illumination device light 2 escaping from the device 1 via transmissive part 110.

FIGS. 3a-3d schematically depict embodiments of the lamps (5) comprising a plurality of illumination devices (1), such as 4 (FIG. 3a-3c) or 2 (FIG. 3d), The lamps 5 comprise a fitting 300, and intermediate part 201, also indicate heat sink housing 201, which comprises a heat sink (not shown), and a lighting part comprising a plurality of illumination devices 1. In principle, any one of the embodiments depicted in FIGS. 1a-1i could be used or adapted to provide the plurality of illumination devices of the embodiments schematically depicted in FIGS. 3a-3d.

The embodiments here schematically depicted in FIGS. 1j and 3a-3d are also indicated as LED retrofit lamps.

The embodiments schematically depicted comprises a support structure 180, which may be mounted on or be part of the heat sink comprised by the heat sink housing 201. The support structure 180 is arranged to support the plurality of illumination devices 1, Further, the support structure 180 may be arranged to provide at least part of the reflective parts 120, respectively. Also, the support structure 180 may be arranged to support the light emitting diode (LED) light sources (10), respectively. All those options are schematically shown in FIGS. 3a-3d. The support structure 180 may be attached to or be integrated with the heat sink in the heat sink housing 201 (see also below).

Figure 3A:
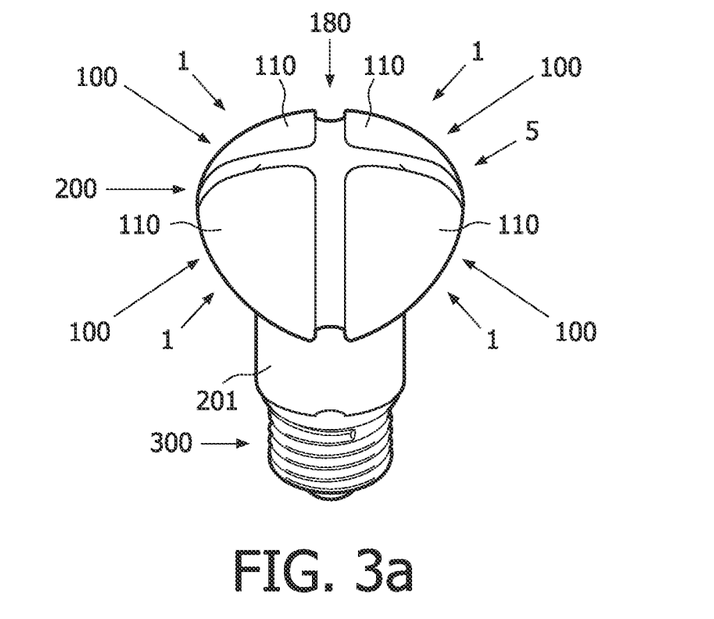
FIGS. 3a-3d schematically depict further embodiments of lamps comprising 4 or 2 illumination devices respectively.

FIG. 3a schematically depicts an embodiment comprising 4 illumination devices, which are enclosed by the wings of the cross-like support structure 180. Actually, the support-structure 180 forms the supports 150 of the illumination devices 10 (see FIG. 3b). Further, the support structure 180 may especially comprise ceramic material, leading to an advantageous heat transfer away from the light sources 10. Hence, the support structure is here also arranged as heat sink 200. Further, in those embodiments, preferably the support structure 180 is reflective. Hence, the support structure 180 is also arranged as reflective parts 120 of the respective illumination devices 1.

The support structure 180 and the heat sink in the heat sink housing 201 may be one integral ceramic part, wherein preferably at least part of the support structure 180 is reflective. In this way an integral ceramic element may be provided, which is advantageous in view of heat dissipation. The support structure 180 may have the function of heat spreader, electrical isolator and optical reflector. Further, since the transmissive parts 120 may also be ceramic, also those parts may improve heat dissipation, and may actually also have the function of heat sink.

Figure 3B:
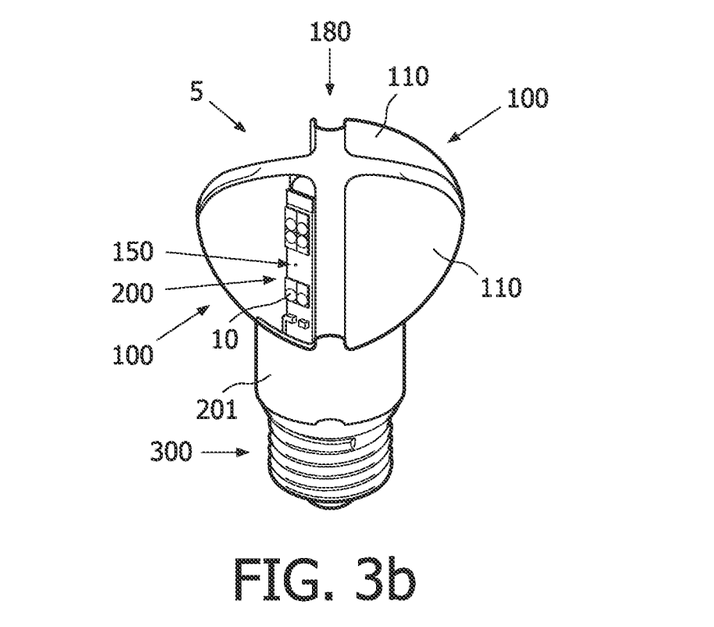
Figure 3C:
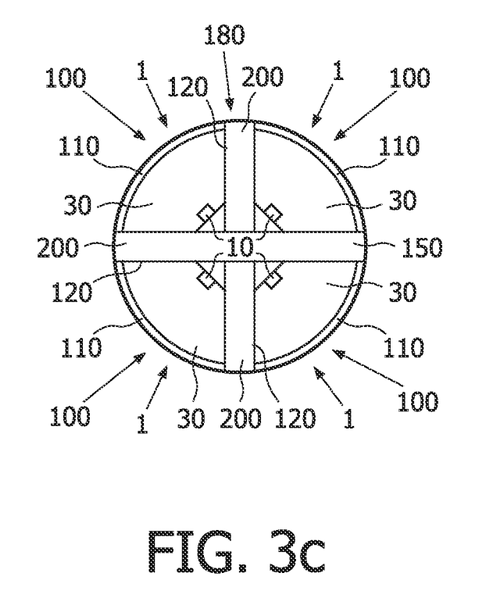

FIG. 3c schematically depicts an example of a cross-section of the embodiments schematically depicted in FIGS. 3a-3b. Note that these embodiments show a kind of cloverleaf with different compartments (each having its "own" chamber 30). The light sources 10 in the individual compartments may be arranged to provide white light, but may also be arranged to provide colored light. In an embodiment, luminescent material may be used to convert at least part of the light source light (see above).

In a specific embodiment, the luminescent material is provided as internal coating to at least part of the transmissive part(s) 110 (see for instance also FIGS. 1a, 1b, 1h).

In another embodiment, the luminescent material is applied as internal coating to at least part of the transmissive part(s) 110 and comprises a yellow emitting luminescent material that is further arranged to provide such yellow emission upon excitation by blue light (such as garnet material as mentioned above). One or more of the light sources 10 in the illumination device(s) 1 comprising said luminescent material is arranged to provide blue light, further, one or more of the light sources 10 in the illumination device(s) 1 comprising said luminescent material is arranged to provide red light. In this way, a large color gamut may be achieved.

Also a mixture of luminescent materials may be applied. This may apply for all embodiments described herein, unless indicated otherwise.

Figure 3D:
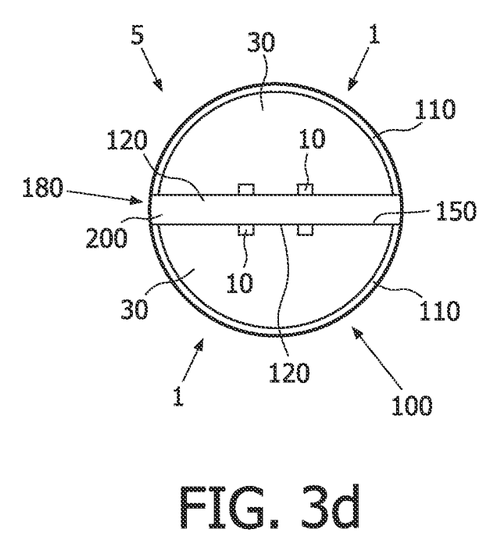

FIG. 3d (cross-sectional view) schematically depicts the same embodiments as schematically depicted in FIGS. 3a-3c, with the exception that the lamp 1 comprises "only" two illumination devices 1. Again, at least part of the support structure 180 has the function of support 150 of the illumination devices 1, the function of heat sink 200, and the function of reflective part 120.

In the above examples, the LED light sources may be arranged on a PCB, or may also be arranged directly on ceramic material, such as the support 150.

Ceramics are inert and therefore have a long lifetime, which means they can keep up with the (expected) lifetime of LEDs, whereas plastics, metals and organic coatings will degrade over time. It also means that they don't need a flame rating. Ceramics can be made highly reflective (above 99% total reflection) better even than many dedicated plastic compounds. As indicated above, ceramics can be designed to have good thermal conductivity (up to 35 W/mK, or even higher). Thermal performance on a system level can be better than with the use of metal heat sinks, due to the fact that electrical insulators between LEDs and heat sinks are no longer necessary. When ceramic submounts are used, lifetime will increase due to good CTE (coefficient of thermal expansion) matching. Hence, an "all" ceramic device with ceramic parts as support, as heat sink, as transmissive part may be provided, having the advantages of high reflection at reflective parts, good transmission through the windows, and overall good heat sink properties, Hence, the invention also provides a (full) ceramic LED retrofit lamp.

Hence, advantageously, ceramic material may be applied in high light intensity and/or high temperature applications:

In applications with many high power LEDs on a small surface;

Thermally conductive ceramic that conducts heat to metal parts of the design;

Thermally conductive ceramic that has appropriate optical qualities to e.g. serve as carrier for luminescent material. If required translucent or more scattering (as diffuser);

Luminescent material can be used as layer on top of ceramics or incorporated in the ceramic matrix and thus converts for instance blue LED light;

The ceramic material is highly resistant against high flux and high temperature. There is no breakdown of organic material, like yellowing of polymers and no deformation;

The ceramic can be sized and shaped according to specifications;

Hence, ceramic material can be used in illumination devices 1 for heat dissipation; further, (the) same ceramic material may be used as transmissive part or as reflective part.

EXAMPLE

The following devices were made: boards with a high density of LEDs with heat sink with e.g. 9 LEDs on 260 mm² or 16 LEDS on 310 mm², with short distance of luminescent material (luminescent material proximity ~5-10 mm) in conversion chamber. The luminescent material was incorporated in a ceramic or applied in an appropriate coating, to provide the transmissive part.

Ceramic material as transmissive part was tested and compared with glass, polycarbonate, and PET film (as transmissive part comprising luminescent material). In addition to the temperature of those parts, respectively, as function of the power provided to the LEDs, also the temperature of the heat sink was measured. Measurements (FIG. 2) showed the remote phosphor on ceramics had a 60° C. lower temperature than on polycarbonate PC or glass.

Figure 2:
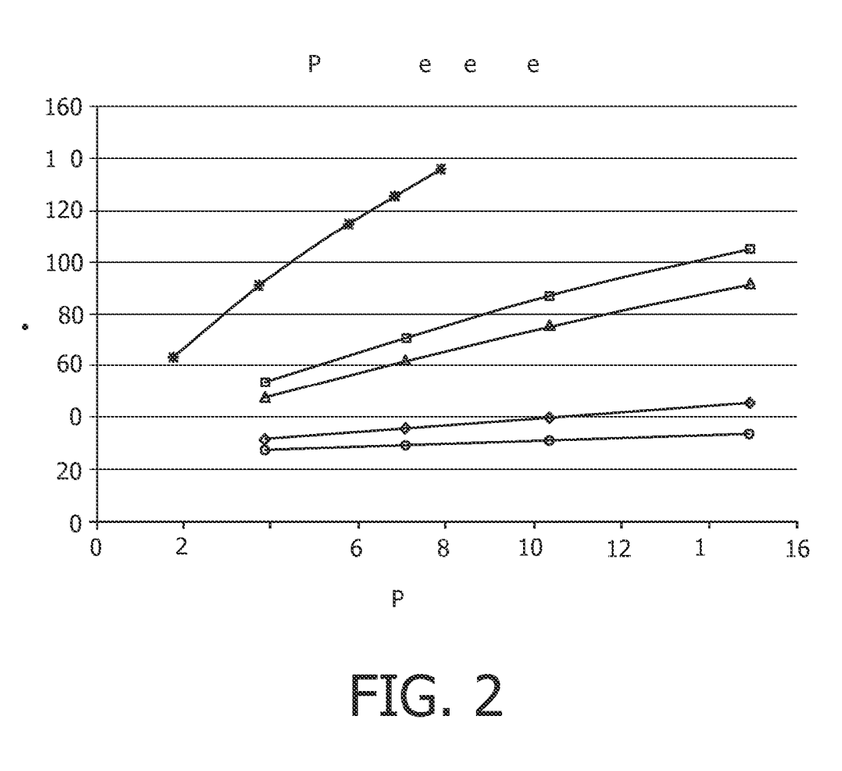
FIG. 2 shows temperature measurements on a transmissive part comprising a luminescent material (as coating or embedded), wherein the transmissive part is a ceramic, glass, polycarbonate, or a PET layer, and of the heat sink, as function of the power supplied to the light sources.

FIG. 2 depicts from top to below the following temperature curves as function of the input power: luminescent material temperature of PET reference transmissive material comprising luminescent material (stars); luminescent material temperature with polycarbonate transmissive material with the luminescent material as upstream coating (cubes); luminescent material temperature with glass transmissive material with the luminescent material as upstream coating (triangles); luminescent material temperature with polycarbonate ceramic transmissive material with the luminescent material as upstream coating (diamonds); and reference temperature of the heat sink.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed, Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "about" preceding values refers to embodiments wherein the values may slightly deviate, as will be understood by the person skilled in the art, but may also include embodiments wherein the values are substantially exactly the values indicated. In general, values like about 400 nm may include 390.5-400.5 nm, as is known to the person skilled in the art.

The devices herein are amongst others described during operation. For instance, the term "blue LED" refers to an LED which during operation thereof generates blue light; in other words: the LED is arranged to emit blue light. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim, Use of the verb "to comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:
1. A lamp, comprising:
a fitting;
a support structure coupled to the fitting, the support structure defining at least a first compartment and a second compartment, the first compartment and the second compartment each including a reflective part comprising a reflective ceramic material;

one or more first compartment LEDs supported by the support structure in the first compartment;

wherein the first compartment LEDs are arranged to generate first compartment light source light, and the reflective part of the first compartment is arranged to reflect at least part of the first compartment light source light;

one or more second compartment LEDs supported by the support structure in the second compartment;

wherein the second compartment LEDs are arranged to generate second compartment light source light, and the reflective part of the second compartment is arranged to reflect at least part of the second compartment light source light; and one or more transmissive parts arranged to transmit at least part of the first compartment light source light and the second compartment light source light, thereby providing lamp light downstream of the transmissive parts;

wherein the fitting is arranged about a central axis and wherein a second axis that is perpendicular to the central axis intersects at least one of the first compartment LEDs and intersects at least one of the transmissive parts.

2. The lamp of claim 1, wherein the first compartment and the second compartment each include a luminescent material.

3. The lamp of claim 2, wherein the luminescent material of the first compartment is downstream of and spaced from the first compartment LEDs.

4. The lamp of claim 1, wherein the fitting is rotatable about the central axis to enable installation of the lamp.

5. The lamp of claim 4, wherein the first compartment LEDs are mounted on a surface that is substantially parallel to the central axis.

6. The lamp of claim 4, wherein the first compartment LEDs include a first LED and a second LED arranged along a first compartment LED axis that is substantially parallel to the central axis, the first LED being more proximal to the fitting than the second LED is to the fitting.

7. The lamp of claim 1, wherein the reflective part of the first compartment is arranged to restrict the first compartment light source light to the first compartment prior to transmission of the at least part of the first compartment light source light through the one or more transmissive parts.

8. The lamp of claim 1, wherein the one or more transmissive parts include a first transmissive part arranged to transmit the at least part of the first compartment light source light and a second transmissive part arranged to transmit the at least part of the second compartment light source light.

9. The lamp of claim 1, further comprising an intermediary part interposed between the fitting and the support structure.

10. The lamp of claim 9, wherein the intermediary part includes a heat sink.

11. The lamp of claim 10, wherein the support structure is attached to or integrated with the heat sink.

12. A lamp, comprising:

a fitting arranged about a central axis and rotatable about the central axis to enable installation of the lamp;

one or more first envelope LEDs configured to generate first light source light primarily directed toward a transmissive part;

a support structure coupled to the fitting, the support structure comprising ceramic material and defining, for a first envelope of the lamp:

a support arranged substantially parallel to the central axis and supporting the first envelope LEDs; and a reflective part that comprises a reflective ceramic material and is arranged to reflect at least part of the first light source light;

wherein the transmissive part is arranged to transmit at least part of the first light source light, thereby providing lamp light downstream of the transmissive part.

13. The lamp of claim 12, wherein the first envelope includes a luminescent material arranged to absorb at least part of the first light source light and emit luminescent material light.

14. The lamp of claim 13, wherein the luminescent material of the first envelope is downstream of and spaced from the first envelope LEDs.

15. The lamp of claim 14, wherein the luminescent material is provided as an internal coating to at least part of the transmissive part.

16. The lamp of claim 14, wherein the luminescent material is upstream of and spaced from the transmissive part.

17. The lamp of claim 12, wherein the reflective part is arranged to restrict the first light source light to the first envelope prior to transmission of the at least part of the first light source light through the transmissive part.

18. A lamp, comprising:

a fitting arranged about a central axis and rotatable about the central axis to enable installation of the lamp;

one or more first LEDs configured to generate first light source light;

one or more second LEDs configured to generate second light source light;

a support structure coupled to the fitting, the support structure comprising reflective ceramic material and defining at least a first chamber and a second chamber, the first chamber including a first support arranged substantially parallel to the central axis and supporting the first LEDs, and the second chamber including a second support arranged substantially parallel to the central axis and supporting the second LEDs one or more transmissive parts arranged to transmit at least part of the first light source light and the second light source light, thereby providing lamp light downstream of the transmissive parts, wherein the at least part of the first light source light and the at least part of the second light source light comprise unreflected light of the first light source light and the second light source light.

19. The lamp of claim 18, further comprising a heatsink interposed between the fitting and the support structure, the heatsink being attached to or integrated with the support structure.

20. The lamp of claim 19, wherein the support structure and the heatsink are one integral ceramic part.

* * * * *